United States Patent
Bjorkman et al.

(10) Patent No.: US 10,190,932 B2
(45) Date of Patent: Jan. 29, 2019

(54) METHOD FOR PREVENTING GASES AND FLUIDS TO PENETRATE A SURFACE OF AN OBJECT

(71) Applicant: INFICON GMBH, Bad Ragaz (CH)

(72) Inventors: Per Bjorkman, Palsbole (FI); Bjorgvin Hjorvarsson, Knivsta (SE)

(73) Assignee: INFICON GMBH, Bad Ragaz (CH)

( * ) Notice: Subject to any disclaimer, the term of this patent is extended or adjusted under 35 U.S.C. 154(b) by 323 days.

(21) Appl. No.: 15/033,037

(22) PCT Filed: Oct. 28, 2013

(86) PCT No.: PCT/EP2013/072494
§ 371 (c)(1),
(2) Date: Apr. 28, 2016

(87) PCT Pub. No.: WO2015/062620
PCT Pub. Date: May 7, 2015

(65) Prior Publication Data
US 2016/0252419 A1    Sep. 1, 2016

(51) Int. Cl.
| | | |
|---|---|---|
| B81B 3/00 | (2006.01) |
| G01L 19/06 | (2006.01) |
| C23C 8/10 | (2006.01) |
| C23C 28/00 | (2006.01) |
| G01L 9/00 | (2006.01) |
| C23C 8/06 | (2006.01) |

(Continued)

(52) U.S. Cl.
CPC ........... *G01L 19/0627* (2013.01); *C23C 8/06* (2013.01); *C23C 8/10* (2013.01); *C23C 14/021* (2013.01); *C23C 14/14* (2013.01); *C23C 16/45525* (2013.01); *C23C 22/02* (2013.01); *C23C 28/323* (2013.01); *C23C 28/325* (2013.01); *G01L 7/082* (2013.01); *G01L 9/0044* (2013.01)

(58) Field of Classification Search
CPC ................. G10L 19/147; G10L 9/0042; B81B 2201/0264
USPC ........................................................ 257/419
See application file for complete search history.

(56) References Cited

U.S. PATENT DOCUMENTS

| | | |
|---|---|---|
| 5,549,797 A | 8/1996 | Hashimoto et al. |
| 6,030,709 A | 2/2000 | Jensen et al. |

(Continued)

FOREIGN PATENT DOCUMENTS

| | | |
|---|---|---|
| JP | 2003-166044 | 6/2003 |
| JP | 2012-137435 | 7/2012 |

OTHER PUBLICATIONS

International Search Report and Written Opinion for PCT App No. PCT/EP2013/072494 dated Jul. 9, 2014, 12 pgs.

(Continued)

*Primary Examiner* — Gregory E Webb
(74) *Attorney, Agent, or Firm* — Procopio, Cory, Hargreaves & Savitch LLP

(57) ABSTRACT

The present invention relates to a method for preventing gases and fluids to penetrate a surface of an object, comprising the steps of: depositing (S1) an amorphous metal (5) on a surface of an object (4); forming (S2) a continuous layer of the amorphous metal (5) on the surface of the object (4); binding (S3) the amorphous metal (5) to the surface of the object by chemical binding; and passivation (S4) of a surface of the amorphous metal (5) facing away from the surface of the object (4).

12 Claims, 3 Drawing Sheets

(51) Int. Cl.
*C23C 14/02* (2006.01)
*C23C 14/14* (2006.01)
*C23C 16/455* (2006.01)
*C23C 22/02* (2006.01)
*G01L 7/08* (2006.01)

(56) References Cited

U.S. PATENT DOCUMENTS

| | | | | |
|---|---|---|---|---|
| 6,085,596 | A * | 7/2000 | Jensen | G01L 9/0054 73/754 |
| 2007/0013014 | A1 * | 1/2007 | Guo | C23C 14/021 257/417 |
| 2009/0108382 | A1 * | 4/2009 | Eriksen | C23C 14/021 257/419 |
| 2010/0044810 | A1 * | 2/2010 | Eriksen | G01L 9/0042 257/415 |
| 2013/0029174 | A1 | 1/2013 | Chiang et al. | |
| 2014/0242328 | A1 * | 8/2014 | Lopatin | G01D 11/245 428/119 |

OTHER PUBLICATIONS

Soroka, L, et al., Structural Stability and Oxidation Resistance of Amorphous Zr—Al Alloys, Journal of Nuclear Materials, 2010, 401, pp. 35-45.

* cited by examiner

METHOD FOR PREVENTING GASES AND FLUIDS TO PENETRATE A SURFACE OF AN OBJECT

This application is a National Stage entry of PCT Application No. PCT/EP2013/072494, filed on Oct. 28, 2013.

TECHNICAL FIELD OF THE INVENTION

The present invention relates to a method for preventing gases and fluids to penetrate a surface of an object. Furthermore, the present invention relates to a membrane as well as to a pressure transducer.

BACKGROUND OF THE INVENTION

Surface corrosion and hydrogen uptake of materials are well known challenges within the processing industry/research. Chemically active elements will oxidize or form hydroxides when exposed to ambient atmosphere, resulting in degradation of design properties. When a construction material is in bulk form a thin layer thereof can be sacrificed, forming for example near surface oxides. Examples of this are the use of stainless steel, Inconel™, Hasteloy™, and similar metals, in which selective surface segregation give rise to appropriate chemical stability.

The presence of grain boundaries in materials is a challenge when making thin layers, in for example membranes, due to selective chemical affinity of the grain boundaries. This often results in unwanted degradation, which can heavily affect the functionality of for example pressure transducers.

Amorphous oxides are commonly used in the semiconductor industry as electric barriers. Furthermore, the use of hard coating is also well established within the optics industry, for coating common and special glasses. The use of thin metal and oxide sheets are common in e.g. membrane pressure sensors.

The use of amorphous Zr—Al alloys for structural stability and oxidation resistance is known through the Journal of Nuclear Materials 401 (2010) pages 38-45, "Structural stability and oxidation resistance of amorphous Zr—Al alloys", by I. L. Soroka et al. In FIG. 1 it is illustrated how corrosive forces and tensile stress may cause cracking 2 along grain boundaries 1 of a metal/alloy, and in FIG. 2 it is illustrated how corrosive forces and tensile stress does not easily crack an amorphous metal/alloy. The surface of the metal/alloy is indicated by reference numeral 3 in FIGS. 1 and 2.

SUMMARY OF THE INVENTION

The limitation of the above methods can be identified as lack of control of leak rate of the membranes. Hydrogen has a special role in this context, due to its large mobility and ease of permeation.

A purpose of the present invention is thus to provide for enhanced tolerance of surfaces to aggressive gases such as hydrogen and oxygen.

One purpose of the present invention is attained by a method for preventing gases and fluids to penetrate a surface of an object, and a membrane, respectively, as defined by the appended claims.

Grain boundaries act as a feeding channel for degradation of near surface regions of poly-crystal materials. Dissociation and diffusion of gases such as hydrogen is accelerated through the large variation in the electron density of such regions. Crystal boundaries also serve as a route for effective transport of hydrogen and other reactive gases to the interior of materials. Removal of grain boundaries can therefore be used to enhance the corrosion resistance of materials.

By coating an object to be protected with an amorphous metal an even coating of the object is achieved, thereby avoiding unnecessary channels for ambient gases/liquids to reach the object. Further, strong binding to the object is important to avoid the coating to come off from the object. Chemical (reactive) binding between the amorphous metal and the object is a very strong binding. This is achieved by selecting appropriate materials of the object and of the amorphous metal. Yet further, the outer surface of the amorphous metal is usually reactive. By passivation of that surface the object is finally protected by a non-penetrable layer, chemically bound to the layer and having a non-reactive surface.

Thus, by providing a method for preventing gases and fluids to penetrate a surface of an object, comprising the steps of: depositing an amorphous metal on a surface of an object; forming a continuous layer of the amorphous metal on the surface of the object; binding the amorphous metal to the surface of the object by chemical binding; and passivation of a surface of the amorphous metal facing away from the surface of the object, enhanced tolerance of the surface is obtained.

The application of the method is particularly useful when the object is made of a metal, in particular of zirconium, or is made of a metal alloy, in particular a zirconium alloy, or is made of a metal alloy comprising a combination of at least two of the elements Ni, Cr, Fe, Mo, CO, Si, Cu and possible trace elements, or is made of a metal alloy, forming oxides or hydroxides upon exposure to air, moisture or water, or is made of a ceramic material, such as aluminium oxide, aluminium nitrate, zirconium oxide or silicon carbide, or is made of a polymer.

The method further comprising the step of: cleaning the surface of the object before the step of depositing to remove possible oxides of the surface of the object, thereby improved binding between the amorphous metal layer and the surface of the object.

The step of depositing is performed, for example, by Atomic Layer Deposition, sputtering or Chemical Vapor Deposition, whereby a well controlled building of the layer is achieved.

The step of passivation is performed, for example, with oxide or nitride, whereby a well controlled passivation may be obtained.

The step of depositing comprises the steps of: depositing a first amorphous metal on the surface of the object forming a continuous layer thereon; and depositing a second amorphous metal on the continuous layer formed by the first amorphous metal forming a continuous layer thereon, wherein the composition of the second amorphous metal differs from the composition of the first amorphous metal. In this way optimization of binding to the surface of the object as well as optimization of passivation to ambient surroundings is facilitated.

The composition of the amorphous metal varies, for example, with the distance from the surface of the object. In this way customization of multiple tolerances to ambient surroundings is facilitated. A straight forward customization is achieved by the composition gradually changing from mainly a first amorphous metal to mainly a second amorphous metal.

A membrane is also provided, wherein a surface thereof is covered with a layer of an amorphous metal, wherein the amorphous metal is chemically bound to the surface of the membrane and wherein the layer comprises a passive surface facing away from the surface of the membrane, whereby enhanced tolerance of the surface is obtained.

For example, the membrane is made of a metal, in particular of zirconium, or is made of a metal alloy, in particular a zirconium alloy, or is made of a metal alloy comprising a combination of at least two of the elements Ni, Cr, Fe, Mo, CO, Si, Cu and possible trace elements, or is made of a metal alloy, forming oxides or hydroxides upon exposure to air, moisture or water, or is made of a ceramic material, such as aluminium oxide, aluminium nitrate, zirconium oxide or silicon carbide, or is made of a polymer.

The amorphous metal comprises, for example, a first layer having a first composition and a second layer having a second composition, wherein the two compositions differ from each other. In this way optimization of binding to the surface of the membrane as well as optimization of passivation to ambient surroundings is facilitated.

The composition of the amorphous metal varies, for example, with the distance from the surface of the membrane. In this way customization of multiple tolerances to ambient surroundings is facilitated. A straight forward customization is achieved by the composition gradually changing from mainly a first amorphous metal to mainly a second amorphous metal.

A pressure transducer comprising a metal membrane is also provided.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The invention is now described, by way of example, with reference to the accompanying drawings, in which.

DETAILED DESCRIPTION

Figure 1:
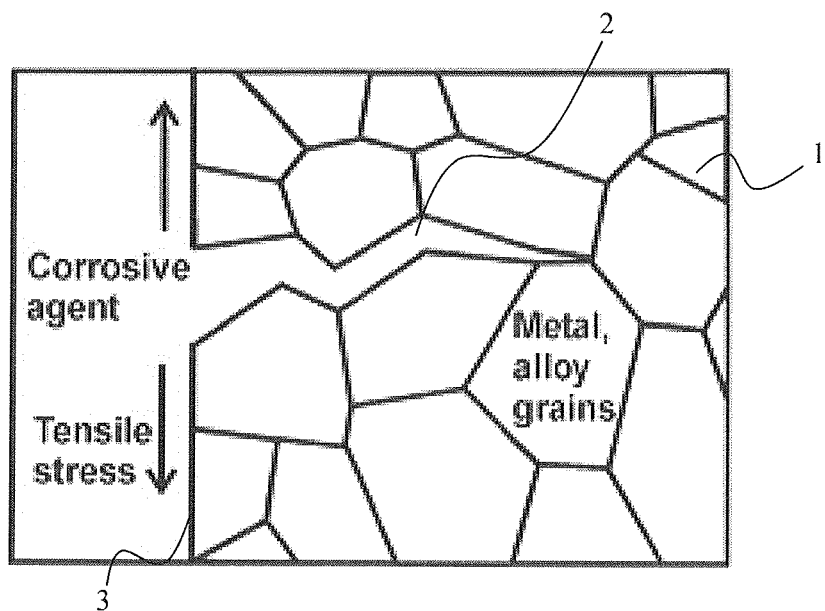
FIG. 1 illustrates stress corrosion cracking of a granular metal/alloy.
Figure 2:
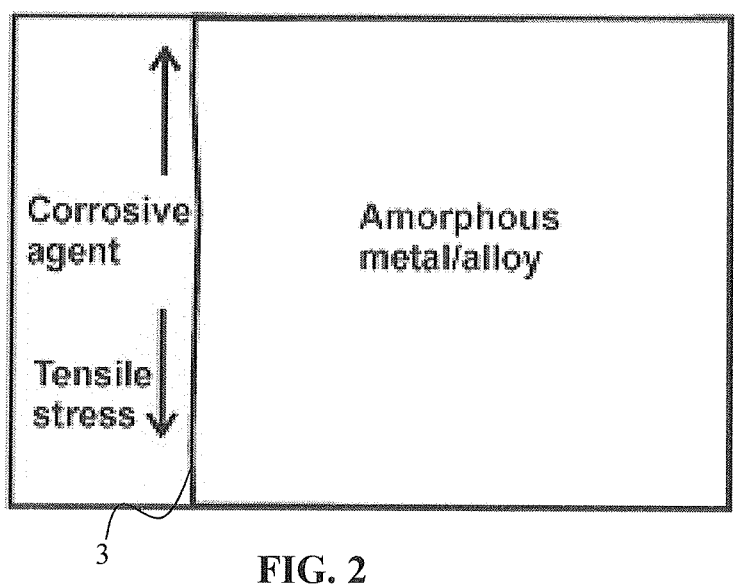
FIG. 2 illustrates stress corrosion forces similar to that in FIG. 1 on an amorphous metal/alloy.

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

A method for preventing gases or fluids from penetrating a surface of a metal object, such as a metal membrane, as well as a metal membrane per se, will now be described with reference to FIGS. 3-6.

The method can be used to effectively hinder degradation of construction materials. The degradation includes e.g. hydrogen uptake from molecular hydrogen, oxidation from molecular oxygen as well as atomic species of the aforementioned elements. The method can also be used to prevent degradation arising from exposure to other chemical elements such as chlorides and fluorides.

Oxides can act as efficient diffusion barriers. Chemical inertness of oxides is determined by the binding energy of the metal atoms and the oxygen, which can therefore be chosen. Selecting oxides with substantially larger formation energy, as compared to hydroxides, reduces for example degradation of the oxide layer when exposed to hydrogen, oxygen or water.

The method is based on deposition of an amorphous metal on the metal object to be protected, forming a continuous layer with large adhesion to a surface of the metal object. The adhesion is accomplished by high reactive binding between the deposited layer and the metal object. By appropriate choice of materials, a reduction of the surface oxide can e.g. take place, effectively forming an interface region with large binding energy between the amorphous metal layer and the underlying metal object. Even though the method is applied, for example, on an object made of metal, it is also possible to be applied to other materials, such as a ceramic material, as—for example—aluminium oxide, aluminium nitrate, zirconium oxide or silicon carbide, or 3o even to objects made of a polymer. To determine if an amorphous metal has a suitable reactivity with the object it is to cover, reference is made to Ellingham diagrams, wherein different materials relative reactivity is revealed.

Upon exposure to oxygen, the aforementioned amorphous metallic layer forms a passivation oxide outer layer, with large adhesion to the underlying amorphous metallic layer. The use of amorphous metallic layers effectively decreases the presence of grain boundaries of the oxidized amorphous metal outer surface. The temperature and exposure time of oxygen, or air, can be chosen for obtaining desired thickness of the protecting layer. Growth of a passivation layer is for oxygen e.g. made at about 1 atom layer per second, when the sticking coefficient is 1 at $10^{-4}$ Pa ($10^{-6}$ mbar). An alternative passivation gas may be nitrogen, forming a layer of nitride.

Manufacturing methods, which can be used to form the aforementioned amorphous metallic layers, e.g. comprises depositing by chemical or physical vapour deposition, such as Atomic Layer Deposition (ALD), sputtering and Chemical Layer Vapour (CVD).

The chemical composition of the amorphous metallic layer is based, for example, on elements with chemical affinity to oxygen. For e.g. aluminium based layers elements X that can be used are Ti, Zr, Hf, Sc, Y and La as well as the lanthanides and the actinides, as well as combinations of those elements. When an amorphous $AlX_y$ layer is exposed to oxygen it forms an oxide layer, amorphous in structure, invoked by the limited diffusion rate at the exposure temperature. These elements fulfil the criteria mentioned above, with respect to enthalpy of formation of the metal oxides. Furthermore, the oxides formed in the near surface region of the amorphous layers are amorphous with low density of diffusion channels, effectively hindering the degradation in ambient air, even at elevated temperatures. Different applications require different working temperatures. For e.g. pressure transducers a working temperature of a few hundred degrees Celsius is usually acceptable, whereas for material in a nuclear power plant a working temperature of several thousands degrees Celsius may be required. In nuclear power plants a preferred material is zirconium based alloys (for example, known under the trade name Zircaloy™).

Adhesion between a protected surface of an object and the protecting passive amorphous layer may be hindered by an oxide layer on the covered surface. Prior to coating of an object with amorphous metallic layers, the surface to be protected can thus advantageously be cleaned by chemical or physical methods or other means, to further enhance adhesion between the coating layer and the covered material. This will result in a better adhesion between the amorphous coating and the underlying material.

The method for preventing gases and fluids to penetrate a surface of a metal object, comprising the steps of: depositing S1 an amorphous metal 5 on a surface of an object 4; forming S2 a continuous layer of the amorphous metal 5 on the surface of the object 4; binding S3 the amorphous metal 5 to the surface of the object by chemical binding; and passivation S4 of a surface of the amorphous metal 5 facing away from the surface of the object 4. The step of passivation forms an oxide layer 10 on the amorphous surface facing away from the metal object.

Figure 3A:
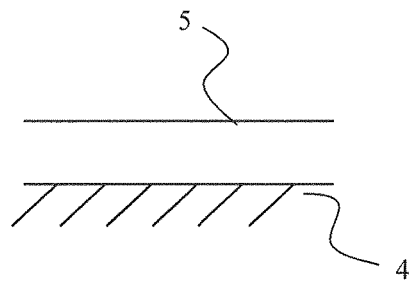
FIGS. 3A-3D illustrate, in a cut-away side view, different embodiments of amorphous metal layers on a metal object.
Figure 4:
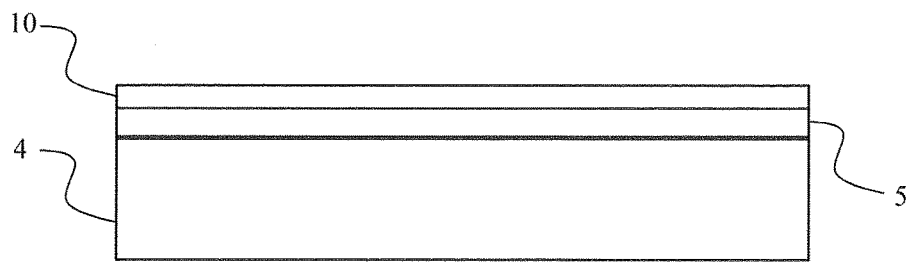
FIG. 4 illustrates, in a side view, a surface of an object having a passive amorphous layer thereon.
Figure 5:
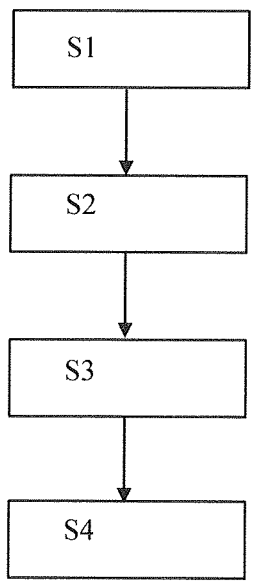
FIG. 5 shows method steps of an embodiment of a method for protecting a metal object.
Figure 6:
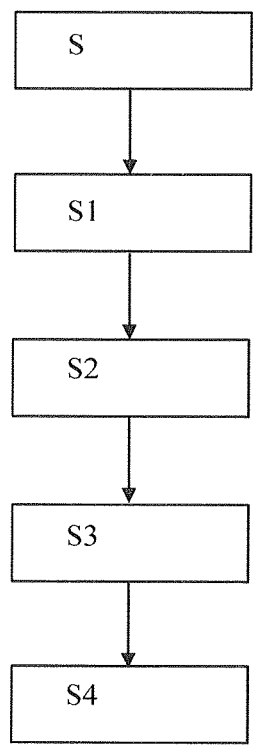
FIG. 6 shows method steps of an embodiment of a method for protecting a metal object, having an additional cleaning step compared to the method shown in FIG. 5.

The step of depositing is performed, for example, by Atomic Layer Deposition, sputtering or Chemical Vapor Deposition. A metal object 4 coated by an amorphous metal layer 5 is thus obtained, which is illustrated in FIGS. 3A and 4.

In a further embodiment of the present invention, the method further comprises the step of: cleaning S the surface of the object before the step of depositing S1 to remove possible oxides of the surface of the object, thereby improving binding there between.

The step of passivation S4 of a surface of the amorphous metal transforms a part thereof near the outer surface thereof facing away from the surface of the metal object. The amorphous metal 5 is exposed, for example, to a controlled environment of oxygen to allow the exposed surface thereof to be passive. It is however also possible to expose it to a more uncontrolled ambient air, or yet alternatively to a controlled environment of nitrogen, forming nitrides.

Figure 3B:
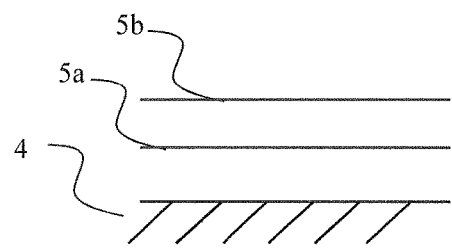

The step of depositing S1 comprises, for example, the steps of: depositing a first amorphous metal on the surface of the object forming a continuous layer 5a thereon; and depositing a second amorphous metal on the continuous layer formed by the first amorphous metal forming a continuous layer 5b thereon, wherein the composition of the second amorphous metal differs from the composition of the first amorphous metal. This is illustrated in FIG. 3B, wherein the metal object 4 is coated by two layers of amorphous metal.

In this way a composition of the amorphous metal in the first layer 5a may be selected to optimize binding to the metal object and a composition of the amorphous metal in the second layer 5b may be selected to optimize resilience to an expected environment and at the same time have better binding to the first layer compared to what the binding would have been to the metal object if directly applied thereon.

Figure 3C:
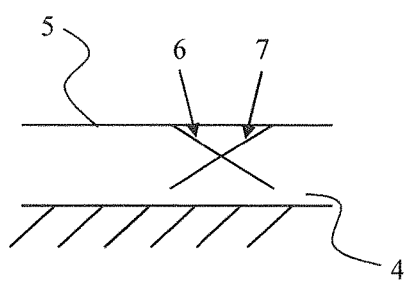

In a further embodiment the step of depositing an amorphous metal is performed such that the composition of the amorphous metallic layer 5 formed on the surface of the metal object 4 varies with the distance from the surface, which is illustrated in FIG. 3C. In this way the varying relative content of the amorphous metal layer 5 is dependent on distance from the metal membrane is linear. The composition of the amorphous metal is in this example changed from mainly comprising a composition 6 at the outer surface to a composition 7 at the surface of the metal object.

Figure 3D:
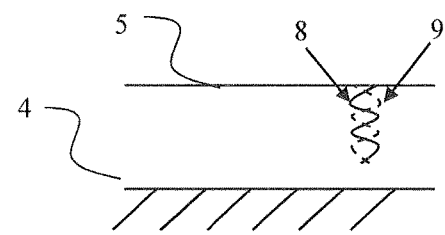

In yet a further embodiment the step of depositing two different compositions 8 and 9 of the amorphous metal gradually changes between the outer surface and the metal object, which is illustrated in FIG. 3D. In this way the varying relative content of the amorphous metal layer 5 dependent on distance from the metal membrane 4 is undulating.

When the amorphous metal comprises a layer having two different compositions with varying relative content dependent on the distance from the metal membrane, protection from a complex hostile environment may be provided by customizing different compositions relative each other in the amorphous metal layer.

Combinations of the different compositions illustrated in FIGS. 3B-3D are also possible.

Although the object has been detailed as a metal object, the same principle may be applied to other objects, such as e.g. plastic objects.

A metal membrane coated with an amorphous metal is also contemplated, illustrated in FIG. 4.

The metal membrane 4 has a surface thereof that is covered with a layer of an amorphous metal 5, wherein the amorphous metal 5 is chemically bound to the surface of the membrane 4 and wherein the layer 5 comprises a passive surface 10 facing away from the surface of the membrane 4.

A typical thickness for a metal membrane used in a pressure transducer is from about 5 µm to about 5 mm. A typical thickness of an amorphous metal layer is from about 1 nm to about 1 µm. A typical thickness of an oxide layer of the amorphous metal layer is from about 1 nm to about 100 nm.

The metal membrane is made up, for example, by a metal alloy containing a combination of one or more of the following elements: Ni, Cr, Fe, Mo, Co, Si and Cu and possible trace elements. Metal alloys such as stainless steel, Inconel™ of Hasteloy™ are typically made up by such elements.

The layer of amorphous metal comprises, for example, a first layer having a first composition and a second layer having a second composition, wherein the two compositions differ from each other. Further, the composition of the amorphous metal may vary with the distance from the surface of the membrane.

An amorphous metal comprising a composition of aluminium and zirconium e.g. provides a good resistance against oxygen. A composition of magnesium and fluorine e.g. provides a good resistance against fluorine. An amorphous metal may further comprise a composition of iron and zirconium or a composition of cobalt and zirconium.

For providing a good binding of the amorphous metal layer to the metal membrane, wherein the metal membrane is made up by a stainless steel, a composition of the amorphous metal is advantageously made up by aluminium zirconium, AlZr for example.

Although the membrane has been detailed as a metal membrane, the same principle may be applied to other materials, such as e.g. plastic membranes.

A pressure transducer comprising a metal membrane is also contemplated.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A method for preventing gases and fluids to penetrate a surface of an object, comprising the steps of:
    depositing (S1) an amorphous metal (5) on a surface of an object (4), wherein the depositing comprises:
        depositing a first amorphous metal on said surface of said object forming a continuous layer (5a) thereon; and
        depositing a second amorphous metal on the continuous layer formed by the first amorphous metal forming a continuous layer (5b) thereon, wherein the composition of said second amorphous metal differs from the composition of said first amorphous metal;
    forming (S2) a continuous layer of said amorphous metal (5) on said surface of said object (4);
    binding (S3) said amorphous metal (5) to said surface of said object by chemical binding; and
    passivation (S4) of a surface of said amorphous metal (5) facing away from said surface of said object (4).

2. The method according to claim 1, wherein said object is made of at least one of the following materials:
    a metal, in particular zirconium;
    a metal alloy, in particular a zirconium alloy;
    a metal alloy comprising a combination of at least two of the elements Ni, Cr, Fe, Mo, Co, Si, Cu and possible trace elements;
    a metal alloy, forming oxides or hydroxides upon exposure to air, moisture or water;
    a ceramic material, such as aluminium oxide, aluminium nitrate, zirconium oxide or silicon carbide;
    a polymer.

3. The method according to claim 1, comprising the step of:
    cleaning (S) said surface of said object before said step of depositing (S1) to remove possible oxides of said surface of said object.

4. The method according to claim 1, wherein said step of depositing (S2) is performed by Atomic Layer Deposition, sputtering or Chemical Vapor Deposition.

5. The method according to claim 1, wherein said step of passivation (S4) is performed with oxide or nitride.

6. The method according to claim 1, wherein the composition of the amorphous metal varies with the distance from said surface of said object.

7. The method according to claim 6, wherein said composition gradually changes from mainly a first amorphous metal to mainly a second amorphous metal.

8. A membrane (4), characterized in that a surface thereof is covered with a layer of an amorphous metal (5) wherein the layer of amorphous metal comprises a first layer having a first composition and a second layer having a second composition, wherein the two compositions differ from each other, and
    wherein said amorphous metal is chemically bound to said surface of said membrane and wherein said layer comprises a passive surface facing away from said surface of said membrane.

9. The membrane of claim 8, wherein said membrane being made of at least one of the following materials:
    a metal, in particular zirconium;
    a metal alloy, in particular a zirconium alloy;
    a metal alloy, forming oxides or hydroxides upon exposure to air, moisture or water;
    a metal alloy comprising a combination of at least two of the elements Ni, Cr, Fe, Mo, Co, Si, Cu and possible trace elements;
    a ceramic material, such as aluminium oxide, aluminium nitrate, zirconium oxide or silicon carbide;
    a polymer.

10. The membrane of claim 8, wherein the composition of the amorphous metal varies with the distance from said surface of said membrane.

11. The membrane of claim 10, wherein said composition gradually changes from mainly a first amorphous metal to mainly a second amorphous metal.

12. A pressure transducer comprising a membrane according to claim 8.

* * * * *